US012637787B2

(12) United States Patent
Watabe et al.

(10) Patent No.: US 12,637,787 B2
(45) Date of Patent: May 26, 2026

(54) LAMINATED STRUCTURE AND METHOD FOR MANUFACTURING LAMINATED STRUCTURE

(71) Applicant: SHIN-ETSU CHEMICAL CO., LTD., Tokyo (JP)

(72) Inventors: Takenori Watabe, Annaka (JP); Hiroshi Hashigami, Annaka (JP); Masayuki Tanno, Annaka (JP)

(73) Assignee: SHIN-ETSU CHEMICAL CO., LTD., Tokyo (JP)

(*) Notice: Subject to any disclaimer, the term of this patent is extended or adjusted under 35 U.S.C. 154(b) by 407 days.

(21) Appl. No.: 17/633,705

(22) PCT Filed: Jun. 5, 2020

(86) PCT No.: PCT/JP2020/022282
§ 371 (c)(1),
(2) Date: Feb. 8, 2022

(87) PCT Pub. No.: WO2021/039010
PCT Pub. Date: Mar. 4, 2021

(65) Prior Publication Data
US 2022/0316091 A1 Oct. 6, 2022

(30) Foreign Application Priority Data

Aug. 27, 2019 (JP) ................................. 2019-155018
Aug. 28, 2019 (JP) ................................. 2019-156117
Sep. 5, 2019 (JP) ................................. 2019-162451

(51) Int. Cl.
*C30B 25/18* (2006.01)
*C30B 29/16* (2006.01)
(Continued)

(52) U.S. Cl.
CPC .............. *C30B 25/18* (2013.01); *C30B 29/16* (2013.01); *C30B 29/30* (2013.01); *C30B 33/02* (2013.01);
(Continued)

(58) Field of Classification Search
None
See application file for complete search history.

(56) References Cited

U.S. PATENT DOCUMENTS 5,652,674 A * 7/1997 Mizuuchi .............. G02F 1/3558
359/326
2009/0231703 A1* 9/2009 Liu ........................ G02F 1/3558
423/641
(Continued)

FOREIGN PATENT DOCUMENTS

CN 104205296 A 12/2014
CN 105097896 A 11/2015
(Continued)

OTHER PUBLICATIONS

Aug. 18, 2020 International Search Report issued in International application No. PCT/JP2020/022282.
(Continued)

*Primary Examiner* — Tamra L. Dicus
(74) *Attorney, Agent, or Firm* — Oliff PLC

(57) ABSTRACT

A laminated structure includes a crystalline substrate and a crystalline oxide film containing gallium as a main component and having a β-gallia structure, wherein the crystalline substrate is a crystalline substrate containing lithium tantalate as a main component. This provides an inexpensive laminated structure having a thermally stable crystalline oxide film.

6 Claims, 2 Drawing Sheets

1

20

10

(51) Int. Cl.

| | | |
|---|---|---|
| *C30B 29/30* | (2006.01) | |
| *C30B 33/02* | (2006.01) | |
| *H10P 14/20* | (2026.01) | |
| *H10P 14/24* | (2026.01) | |

(52) U.S. Cl.

CPC .......... *H10P 14/24* (2026.01); *H10P 14/2921* (2026.01); *H10P 14/3434* (2026.01); *H10P 14/3466* (2026.01)

(56) References Cited

U.S. PATENT DOCUMENTS

| | | | | |
|---|---|---|---|---|
| 2013/0094214 A1* | 4/2013 | Furuya | .................... | G02F 1/355 |
| | | | | 427/532 |
| 2015/0194479 A1 | 7/2015 | Kaneko et al. | | |
| 2015/0325659 A1 | 11/2015 | Hitora et al. | | |
| 2015/0325660 A1 | 11/2015 | Hitora et al. | | |
| 2016/0265137 A1 | 9/2016 | Goto et al. | | |
| 2018/0073164 A1 | 3/2018 | Goto et al. | | |
| 2018/0097073 A1* | 4/2018 | Oda | ........................ | H01L 29/24 |
| 2019/0067426 A1* | 2/2019 | Sugimoto | ......... | H01L 21/02576 |
| 2019/0214248 A1 | 7/2019 | Nagaoka | | |
| 2019/0237556 A1* | 8/2019 | Tsuruma | .............. | H01L 29/812 |
| 2020/0102667 A1 | 4/2020 | Goto et al. | | |

FOREIGN PATENT DOCUMENTS

| | | | |
|---|---|---|---|
| CN | 105097957 A | 11/2015 | |
| CN | 107532326 A | 1/2018 | |
| JP | H103100 A | * | 1/1998 |
| JP | 2013-058637 A | 3/2013 | |
| JP | 2013088479 A | * 5/2013 | ............... F21V 9/00 |
| JP | 2014-015366 A | 1/2014 | |
| JP | 2014-72463 A | 4/2014 | |
| JP | 2015-091740 A | 5/2015 | |
| JP | 2015-134717 A | 7/2015 | |
| JP | 2016-064961 A | 4/2016 | |
| JP | 2016-082232 A | 5/2016 | |
| JP | 2017-005146 A | 1/2017 | |
| JP | 2017-010966 A | 1/2017 | |
| WO | 2016152335 A1 | 9/2016 | |

OTHER PUBLICATIONS

Aug. 22, 2023 Search Report issued in European Patent Application No. 20857185.1.

Kaneko, Kentaro et al.; "Oriented growth of beta gallium oxide thin films on yttrium-stabilized zirconia substrates"; Physica Status Solidi. C: Current Topics In Solid State Physics; vol. 10; No. 11; 2013; pp. 1596-1599.

Lee, Sam-Dong et al.; "Homoepitaxial growth of beta gallium oxide films by mist chemical vapor deposition"; Japanese Journal of Applied Physics; vol. 55; No. 12; 2016; pp. 1202B8-1-1202B8-6.

Zhang, De-Long et al.; "Diffusivity, solubility and thermodynamic modelling of diffusion growth of Ga3+-doped LiTaO3 thin film for integrated optics"; The Journal of Chemical Thermodynamics; vol. 97; 2015; pp. 93-99.

Oct. 26, 2023 Office Action Issued in Chinese Patent Application No. 202080059393.7.

Nov. 15, 2023 Examination Report Issued in Indian Patent Application No. 202247007926.

* cited by examiner

[FIG. 1]
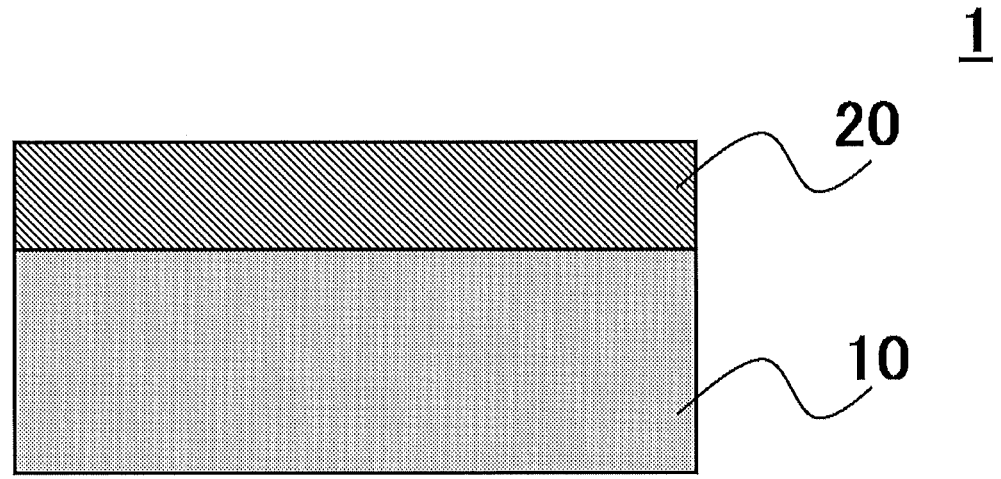
[FIG. 2]
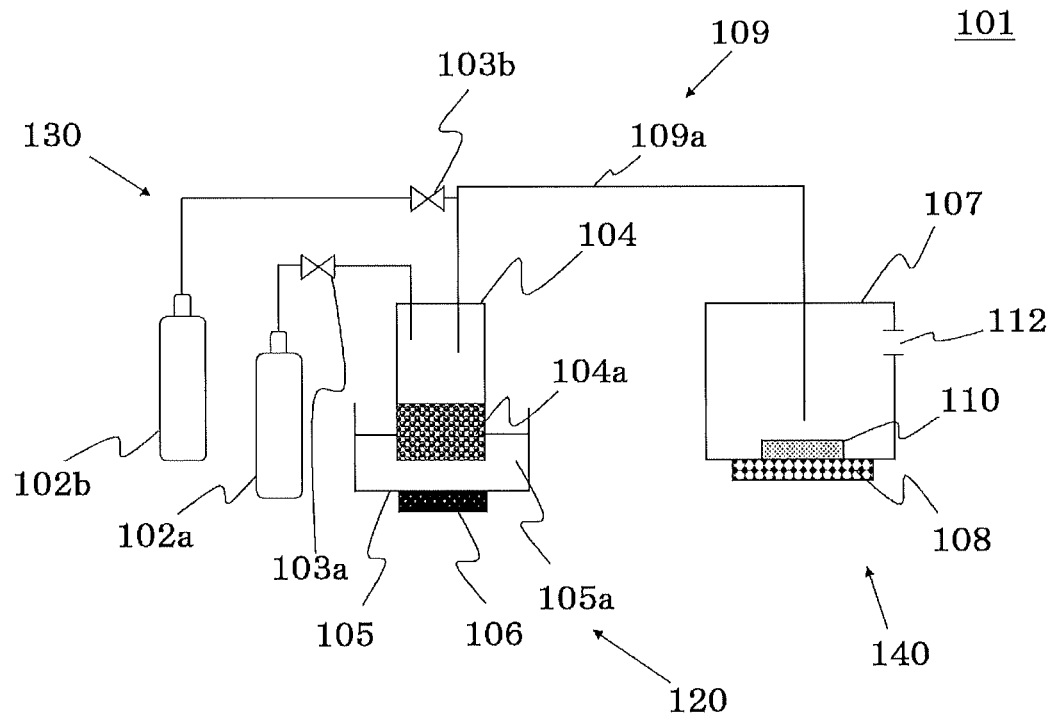

[FIG. 3]
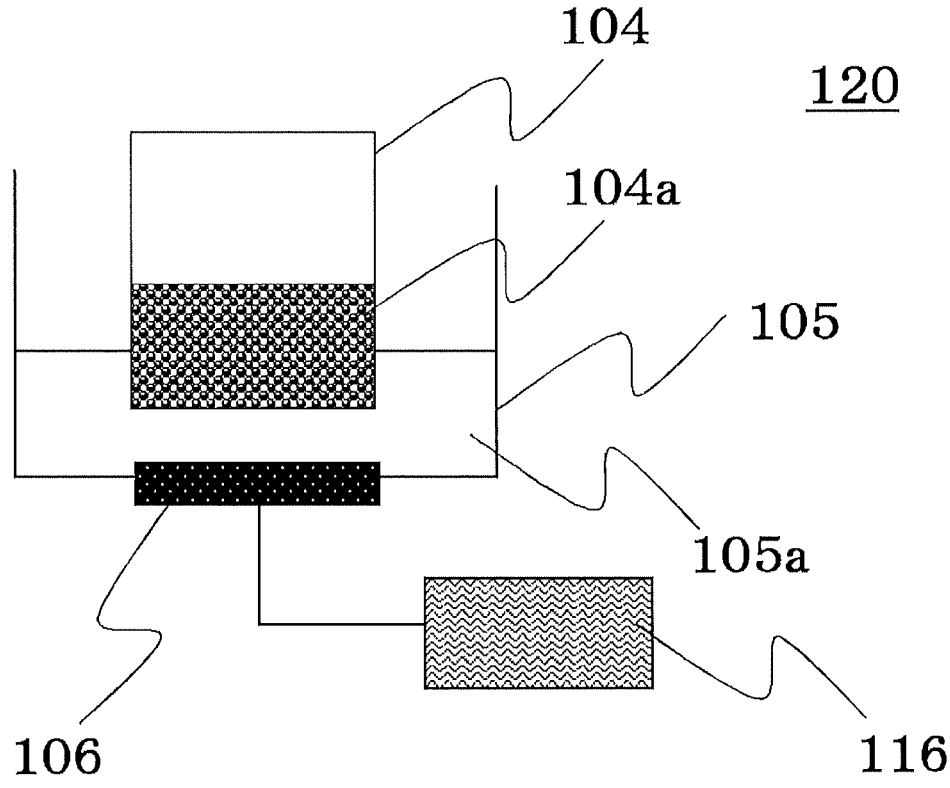
[FIG. 4]
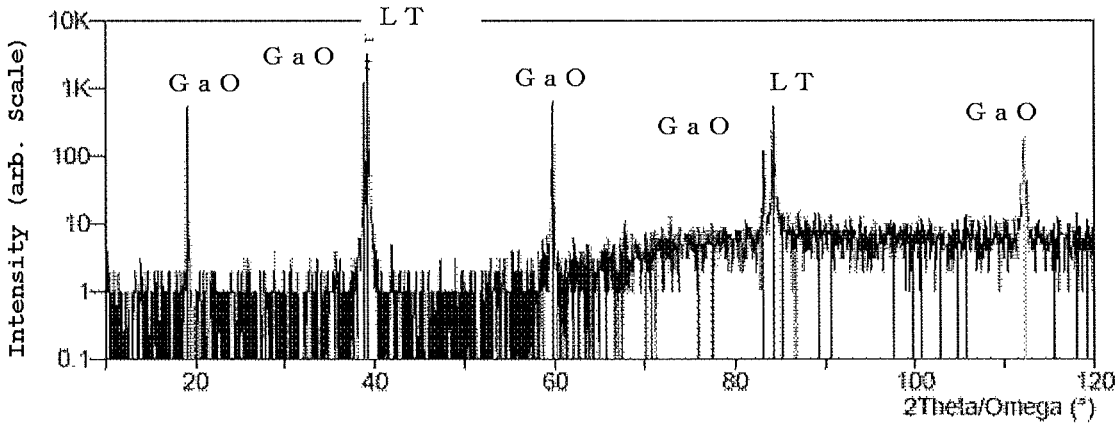

LAMINATED STRUCTURE AND METHOD FOR MANUFACTURING LAMINATED STRUCTURE

TECHNICAL FIELD

The present invention relates to a laminated structure and a method for manufacturing the laminated structure.

BACKGROUND ART

Oxide semiconductors typified by gallium oxide ($Ga_2O_3$) are expected to be applied to next-generation switching devices capable of achieving high breakdown voltage, low loss, and high heat resistance as semiconductors with a large bandgap.

CITATION LIST

Patent Literature

Patent Document 1: JP 2014-072463 A
Patent Document 2: JP 2014-015366 A
Patent Document 3: JP 2015-091740 A

SUMMARY OF INVENTION

Technical Problem

Patent Document 1 describes a method for producing gallium oxide ($\alpha$-$Ga_2O_3$) having a corundum structure at a relatively low temperature, but there is a problem that it is thermally unstable since $\alpha$-$Ga_2O_3$ is a metastable phase.

On the other hand, $\beta$-$Ga_2O_3$ is the most stable phase, and the above-mentioned phase transition does not occur. However, as described in Patent Documents 2 and 3, it is necessary to heat to an extremely high temperature in order to form a film, and a lower temperature, simple and inexpensive film forming method is required.

The present invention has been made to solve the above-mentioned problems. It is an object of the present invention to provide an inexpensive laminated structure having a thermally stable crystalline oxide film, and to provide a film forming method capable of forming a laminated structure having a thermally stable crystalline oxide film by a low temperature process easily and inexpensively.

Solution to Problem

The present invention has been made to achieve the above-mentioned object, and provides a laminated structure comprising a crystalline substrate and a crystalline oxide film containing gallium as a main component and having a $\beta$-gallia structure, wherein the crystalline substrate is a crystalline substrate containing lithium tantalate as a main component.

Such a laminated structure can be obtained easily and inexpensively, and is thermally stable, and can be suitably used for a semiconductor device.

At this time, the laminated structure can comprise a lithium tantalate single crystal substrate as the crystalline substrate.

As a result, the laminated structure having a crystalline oxide film having a $\beta$-gallia structure with higher crystallinity is obtained.

At this time, the laminated structure can comprise $\beta$-$Ga_2O_3$ as a main component of the crystalline oxide film.

This results in the laminated structure having a thermally more stable crystalline oxide film.

At this time, the laminated structure can comprise the crystalline oxide film having a film thickness of 1 μm or more.

This makes it more useful for the semiconductor device.

At this time, the laminated structure can comprise the crystalline oxide film having an area of 100 $mm^2$ or more.

This makes the large area more useful for semiconductor devices.

At this time, there is provided a method for manufacturing a laminated structure, which comprises a method of forming a crystalline oxide film having a $\beta$-gallia structure containing gallium as a main component by thermal reaction of mist onto a substrate, wherein the mist generated by atomizing or dropletizing an aqueous solution containing at least gallium is transferred to the substrate using a carrier gas, and using a crystalline substrate containing lithium tantalate as a main component of the substrate.

According to such a method for producing a laminated structure, a laminated structure containing a crystalline oxide film having a $\beta$-gallia structure can be produced in a low-temperature process with high productivity, easily and inexpensively.

At this time, the method for manufacturing a laminated structure can use a lithium tantalate single crystal substrate as the crystalline substrate.

This makes it possible to produce a laminated structure having a crystalline oxide film having a $\beta$-gallia structure having higher crystallinity.

At this time, the method for manufacturing a laminated structure can use a temperature of the thermal reaction at 250 to 900° C.

As a result, the laminated structure having the $\beta$-gallia structure can be manufactured at a lower temperature, so that not only the running cost can be reduced, but also the time required for manufacturing can be shortened.

At this time, the method for producing a laminated structure can comprise the crystalline oxide film contains $\beta$-$Ga_2O_3$ as a main component.

This makes it possible to provide a laminated structure having a thermally more stable crystalline oxide film.

At this time, the method for producing a laminated structure can comprise the film thickness of the crystalline oxide film being 1 μm or more.

Thereby, a useful laminated structure for the semiconductor device can be obtained.

At this time, the method for manufacturing a laminated structure can comprise a substrate having a film-forming surface area of 100 $mm^2$ or more being used.

Thereby, a laminated structure having a large area can be obtained easily and inexpensively.

At this time, the obtained laminated structure can be annealed to 600 to 1000° C.

Thereby, a higher quality laminated structure can be obtained.

Advantageous Effects of Invention

As described above, according to the laminated structure of the present invention, the laminated structure is thermally stable and can be suitably used for a semiconductor device. Further, according to the method for producing a laminated structure of the present invention, a laminated structure having a $\beta$-gallia structure can be produced easily and inexpensively.

BRIEF DESCRIPTION OF DRAWINGS

FIG. 1 is a schematic sectional drawing which shows an example of the laminated structure the present invention;

FIG. 2 is a schematic block diagram which shows an example of the film forming apparatus used in the manufacturing method of the laminated structure of the present invention;

FIG. 3 is a figure explaining an example of the mist formation part in the film forming apparatus;

FIG. 4 shows a result of evaluating the film obtained in Example 1 by an X-ray diffractometer.

DESCRIPTION OF EMBODIMENTS

Hereinafter, the present invention will be described in detail, but the present invention is not limited thereto.

As described above, it has been demanded to provide an inexpensive laminated structure having a thermally stable crystalline oxide film, and a method for producing the laminated structure having thermally stable crystalline oxide film formed by a low temperature process, easily and inexpensively.

As a result of diligent studies on the above-mentioned problems, the present inventors have found that a laminated structure, comprising a crystalline substrate and a crystalline oxide film containing gallium as a main component and having a β-gallia structure, wherein the crystalline substrate is a crystalline substrate containing lithium tantalate as a main component, can be obtained easily and inexpensively, and is thermally stable, and can be suitably used for semiconductor devices, and completed the present invention.

Further, the present inventors have found that a method for manufacturing a laminated structure, which comprises a method of forming a crystalline oxide film having a β-gallia structure containing gallium as a main component by thermal reaction of mist onto a substrate, wherein the mist generated by atomizing or dropletizing an aqueous solution containing at least gallium is transferred to the substrate using a carrier gas, and using a crystalline substrate containing lithium tantalate as a main component of the substrate, enables to produce a laminated structure having a crystalline oxide film having a β-gallia structure at low temperature with high productivity, and easily and inexpensively, and completed the present invention.

Hereinafter, description will be made with reference to the drawings.

(Laminated Structure)

As shown in FIG. 1, one embodiment of the laminated structure 1 according to the present invention is a laminated structure 1 in which a crystalline oxide film 20 containing gallium as a main component and having a β-gallia structure is laminated on a crystalline substrate 10 containing lithium tantalate as a main component. A buffer layer or the like may be interposed between the crystalline substrate 10 and the crystalline oxide film 20.

Here, the term "crystalline" means that the crystalline state includes a polycrystalline state or a single crystal state. Amorphous may be mixed in polycrystal or single crystal.

(Crystalline Substrate Containing Lithium Tantalate as the Main Component)

First, a crystalline substrate containing lithium tantalate as a main component of the laminated structure according to the present invention will be described.

When producing the laminated structure according to the present invention, first, a crystalline substrate containing lithium tantalate as a main component is prepared. Here, the "crystalline substrate containing lithium tantalate as a main component" includes a substrate containing 50 to 100% lithium tantalate, which contains lithium tantalate as a single crystal or a polycrystalline substrate.

Lithium tantalate has an ilmenite structure and its lattice constant is relatively close to $\alpha$-$Ga_2O_3$. The magnitude relationship between the distances between oxygen atoms on $\alpha$-$Ga_2O_3$ (001) plane, $\beta$-$Ga_2O_3$ (-201) plane, and lithium tantalate (001) plane is generally $\alpha$-$Ga_2O_3$<lithium tantalate<$\beta$-$Ga_2O_3$. Since $\beta$-$Ga_2O_3$ is energetically more stable than $\alpha$-$Ga_2O_3$, it is presumed that $\beta$-$Ga_2O_3$ is preferentially formed on the lithium tantalate substrate without forming $\alpha$-$Ga_2O_3$ even at a low temperature.

As the crystalline substrate containing lithium tantalate as a main component, it is most preferable to use a lithium tantalate single crystal substrate. This is because the quality of the crystalline oxide film becomes the highest quality.

Hereinafter, a lithium tantalate single crystal substrate will be described as an example. The lithium tantalate single crystal substrate can be obtained, for example, by growing a lithium tantalate single crystal by Czochralski method to obtain a lithium tantalate single crystal ingot, and slicing this ingot to process it into a substrate shape.

The lithium tantalate single crystal substrate that can be used in the present invention is preferably cut so that the lattice constant on its surface is close to the lattice constant of the crystalline oxide film to be deposited later. For example, when a crystalline oxide film containing $\beta$-$Ga_2O_3$ as a main component is deposited, it is preferably cut so that the crystal orientation is within Z±10°, and more preferably the crystal orientation is within Z±5°.

Further, in the lithium tantalate single crystal substrate that can be used in the present invention, it is preferable that a uniform polarization state of the substrate promotes uniform growth of the oxide single crystal film. That is, it is preferable that the lithium tantalate substrate is subjected to a single polarization treatment or a multi-polarization treatment.

To obtain a single polarized substrate, for example, a lithium tantalate single crystal ingot prepared by Czochralski method is subjected to polling process in which it is heated to 700° C., and a voltage of 200V is applied in the crystal orientation of Z direction for 10 hours. Then, the ingot may be sliced and processed into a substrate shape. Further, the substrate itself processed into the substrate shape may be heated to 700° C., and a voltage of 200V may be applied in the crystal orientation of Z direction to perform polling processing for 10 hours.

When a substrate that has been subjected to a single polarization treatment is used, if the surface of the substrate is further subjected to a pyroelectricity suppressing treatment, it can be preferably possible to suppress the substrate from being charged when the crystalline oxide film is deposited on the heated substrate. In the pyroelectricity suppression treatment, for example, a lithium tantalate single crystal substrate subjected to a single polarization treatment is embedded in lithium carbonate powder, and is heat treated at a temperature of 350° C. or higher and the Curie temperature (about 610° C.) or lower in a reducing gas atmosphere. At this time, when the treatment is performed so as to make a volume resistivity in the thickness direction of the substrate to be $1.0 \times 10^{11}$ $\Omega$·cm or more and $2.0 \times 10^{13}$ $\Omega$·cm or less, and the ratio of the maximum value to the minimum value of the volume resistivity within the substrate to be 4.0 or less, the substrate can be effectively suppressed from being charged when the crystalline oxide film is deposited thereon.

On the other hand, in order to obtain a multi polarized substrate, for example, a single crystal (ingot or substrate) once single polarized, or a single crystal (ingot or substrate) not subjected to the single polarization treatment is subjected to strain relaxation treatment in which it is heated to 700° C. or higher and annealed for several hours (preferably 1000° C. or higher, preferably 5 hours or longer, more preferably 10 hours or longer), and in the case of an ingot, it is sliced to form a substrate. It is preferable to use a multi polarized substrate because it is possible to suppress the substrate from being charged when the crystalline oxide film is deposited on the heated substrate. In particular, when the average polarization domain size of the substrate surface is set to 5 μm or less, charging can be effectively suppressed. When the charging effect of the lithium tantalate substrate is suppressed, it is preferable that the crystalline oxide film is stably deposited. It is preferable that the composition (at least on the surface of the substrate) of the lithium tantalate single crystal is a congruent composition, because the average domain size of the polarization on the surface of the substrate tends to be small. Here, in the case of lithium tantalate, the congruent composition means that the ratio of Li to Ta is in a range Li:Ta=48.5−α:51.5+α, and α is −0.5≤α≤0.5.

When the surface of the crystalline substrate containing lithium tantalate as a main component is polished smoothly so as to reduce the unevenness, a flat laminated film of the crystalline oxide film can be obtained. Ra is preferably 10 nm or less. It is more preferable that Ra is 5 nm or less.

In addition, frangible layer can be formed directly below deposition surface of the crystalline substrate containing lithium tantalate as the main component on which the crystalline oxide film is deposited in a depth from 50 nm to 3 μm, by implanting ions selected from hydrogen, helium, argon, and other rare gases in advance into the surface of the deposition surface. By doing so, after the crystalline oxide film is deposited, the deposited crystalline oxide film can be easily peeled off from the lithium tantalate single crystal substrate by giving an impact to the frangible layer.

The thickness of the crystalline substrate is not particularly limited, but is preferably 10 to 2000 μm, and more preferably 50 to 800 μm. The area of the substrate is preferably 100 mm² or more, and more preferably the diameter is 2 inches (50 mm) or more.

(Crystalline Oxide Film)

The crystalline oxide film in the laminated structure according to the present invention is a crystalline oxide film containing gallium as a main component and having a β-gallia structure. The crystalline oxide film is usually composed of a metal and oxygen, but in the present invention, there is no problem as long as gallium is the main component of the metal. Here, when the term "gallium is the main component" in the present invention, it means that 50 to 100% of the metal component is gallium. The metal component other than gallium may include, for example, one or more metals selected from iron, indium, aluminum, vanadium, titanium, chromium, rhodium, iridium, nickel and cobalt. The crystalline oxide film may be single crystal or polycrystalline as long as it has a β-gallia structure.

Among the crystalline oxide films having gallium as a main component and having a β-gallia structure, those having β-Ga₂O₃ as a main component are particularly preferable. β-Ga₂O₃ is a thermally more stable crystalline oxide film. When evaluated by X-ray diffraction, α-Ga₂O₃ has a peak near 2θ=40.3°, whereas β-Ga₂O₃ has a peak near 2θ=38.4°, so it is easy to distinguish between the two.

The crystalline oxide film may contain a dopant. For example, n-type dopants such as tin, germanium, silicon, titanium, zirconium, vanadium niobium or the like, and p-type dopants such as copper, silver, tin, iridium rhodium or the like can be mentioned. The dopant is not particularly limited, but is preferably tin. The concentration of the dopant may be, for example, about $1 \times 10^{16}$/cm³ to $1 \times 10^{22}$/cm³, and even if the concentration may be as low as about $1 \times 10^{17}$/cm³ or lower, as a high concentration of about $1 \times 10^{20}$/cm³ or more.

In the present invention, the film thickness of the crystalline oxide film is not particularly limited, but can be 1 μm or more. For example, it may be 1 to 100 μm, preferably 5 to 50 μm, and more preferably 10 to 20 μm. Further, another layer may be interposed between the substrate and the crystalline oxide film. The other layer is a layer having a composition different from that of the crystalline oxide film of the outermost layer and the substrate, and may be, for example, a crystalline oxide film, an insulating film, a metal film, or the like.

The laminated structure according to the present invention or the crystalline oxide film obtained from the laminated structure can be used in a semiconductor device by appropriately designing a structure. It can be formed as a semiconductor layer of each devices, for example, Schottky barrier diode (SBD), metal semiconductor field effect transistor (MESFET), high electron mobility transistor (HEMT), metal oxide film semiconductor field effect transistor (MOSFET), electrostatic induction transistor (SIT), junction electric field effect transistor (JFET), insulated gate type bipolar transistor (IGBT), a light emitting diode (LED), or the like.

(Film Formation Equipment)

In one embodiment of the laminated structure according to the present invention, it is characterized in that it comprises a method of forming a crystalline oxide film having a β-gallia structure containing gallium as a main component by thermal reaction of mist onto a substrate, wherein the mist generated by atomizing or dropletizing an aqueous solution containing at least gallium is transferred to the substrate using a carrier gas, and using a crystalline substrate containing lithium tantalate as a main component of the substrate.

An example of a film forming apparatus 101 that can be used in the method for manufacturing a laminated structure according to the present invention is shown in FIG. 2. The film forming apparatus 101 comprises a mist-forming unit 120 that mists the raw material solution to generate the mist, a carrier gas supply unit 130 that supplies the carrier gas that conveys the mist, a film forming unit 140 that heat-treats the mist to form a film on the substrate, and a transport section 109 that connects the mist-forming unit 120 and the film forming unit 140 and transfers mist by a carrier gas. Further, the film forming apparatus 101 may be controlled in its operation by providing a control unit (not shown) for controlling the whole or a part of the film forming apparatus 101.

Here, the mist in the present invention refers to a general term for fine particles of liquid dispersed in a gas, and includes those called mist, droplets, or the like.

(Raw Material Solution)

The raw material aqueous solution 104a is not particularly limited as long as it contains at least gallium. That is, in addition to gallium, for example, one or more metals selected from iron, indium, aluminum, vanadium, titanium, chromium, rhodium, iridium, nickel and cobalt may be contained. A metal obtained by dissolving or dispersing the metal in water in the form of a complex or a salt can be preferably used. Examples of the form of the complex, an acetylacetonate complex, a carbonyl complex, an ammine complex, and a hydride complex can be mentioned. Examples of the salt form, metal chloride salt, metal bromide salt, metal iodide salt or the like can be mentioned. Further, a salt solution in which the above metal is dissolved in hydrobromic acid, hydrochloric acid, hydrogen iodide or the like can also be used. The solute concentration is preferably 0.01 to 1 mol/L.

The raw material aqueous solution 104a may contain a dopant element. Examples thereof, n-type dopants such as tin, germanium, silicon, titanium, zirconium, vanadium, niobium or the like, and p-type dopants such as copper, silver, tin, iridium, rhodium or the like can be mentioned. The dopant is not particularly limited, but is preferably tin. Moreover, it is preferable that the dopant element is ionized. Therefore, an acid may be mixed with the raw material aqueous solution 104a to promote the dissolution of the dopant element. Examples of the acid, hydrogen halides such as hydrobromic acid, hydrochloric acid and hydroiodic acid, or the like, halogen oxo acids such as, hypochlorous acid, chlorous acid, hypobromous acid, bromous acid, hypoiodous acid, iodous acid or the like, carboxylic acids such as formic acids, nitric acid, or the like can be mentioned. In addition, it is also effective to heat or give ultrasonic waves to promote the dissolution.

(Mist-Forming Unit)

In the mist-forming unit 120, the raw material solution 104a is prepared and the raw material solution 104a is misted to generate mist. The mist-forming means is not particularly limited as long as the raw material solution 104a can be misted, and may be a known mist-forming means, but it is preferable to use a mist-forming means by ultrasonic vibration. This is because it can be made into a mist more stably.

An example of such a mist-forming unit 120 is shown in FIG. 3. For example, a mist generation source 104 containing a raw material solution 104a, a medium capable of transmitting ultrasonic vibrations, for example, a container 105 containing water 105a, and an ultrasonic vibrator 106 attached to the bottom surface of the container 105 may be included. Specifically, the mist generation source 104 composed of a container containing the raw material solution 104a is stored in the container 105 containing the water 105a by using a support (not shown). An ultrasonic vibrator 106 is provided at the bottom of the container 105, and the ultrasonic vibrator 106 and the oscillator 116 are connected to each other. Then, when the oscillator 116 is operated, the ultrasonic vibrator 106 vibrates, the ultrasonic waves propagate into the mist generation source 104 via the water 105a, and the raw material solution 104a is misted.

(Transport Section)

The transport section 109 connects the mist-forming unit 120 and the film-forming unit 140. The mist is transferred by the carrier gas from the mist generation source 104 of the mist-forming unit 120 to the film-forming chamber 107 of the film forming unit 140 via the transport section 109. The transport section 109 may be, for example, a supply pipe 109a. As the supply pipe 109a, for example, a quartz pipe, a resin tube, or the like can be used.

(Film Forming Unit)

The film forming unit 140 heats the mist to cause a thermal reaction to form a film on a part or all of the surface of the substrate (crystalline substrate) 110. The film forming unit 140 is provided with, for example, a film forming chamber 107, and a substrate (crystalline substrate) 110 is installed in the film forming chamber 107, and a hot plate 108 for heating the substrate (crystalline substrate) 110 is provided. The hot plate 108 may be provided outside the film forming chamber 107 as shown in FIG. 2, or may be provided inside the film forming chamber 107. Further, the film forming chamber 107 may be provided with an exhaust gas exhaust port 112 at a position that does not affect the supply of mist to the substrate (crystalline substrate) 110.

Further, in the present invention, the substrate (crystalline substrate) 110 may be placed on the upper surface of the film forming chamber 107 to be face-down, or the substrate (crystalline substrate) 110 may be placed on the bottom surface of the film forming chamber 107 to be face-up.

The thermal reaction may be such that the mist reacts by heating, and the reaction conditions or the like are not particularly limited. It can be appropriately set according to the raw material and the film. For example, the heating temperature can be in a range of 250 to 900° C., preferably in a range of 300° C. to 800° C., and more preferably in a range of 350° C. to 700° C.

The thermal reaction may be carried out in any of a vacuum, non-oxygen atmosphere, reducing gas atmosphere, air atmosphere and oxygen atmosphere, and may be appropriately set according to the film. Further, the reaction pressure may be carried out under any condition of atmospheric pressure, pressurized or reduced pressure, but the film formation under atmospheric pressure is preferable because the apparatus configuration can be simplified.

(Carrier Gas Supply Unit)

The carrier gas supply unit 130 has a carrier gas source 102a for supplying the carrier gas, and a flow rate control valve 103a for adjusting the flow rate of the carrier gas (hereinafter, referred to as "main carrier gas") sent out from a carrier gas source 102a may be provided. Further, it is also possible to provide a dilution carrier gas source 102b for supplying a dilution carrier gas as needed, and a flow rate control valve 103b for adjusting the flow rate of the dilution carrier gas sent out from the dilution carrier gas source 102b.

The type of carrier gas is not particularly limited and can be appropriately selected depending on the film. For example, oxygen, ozone, an inert gas such as nitrogen or argon, or a reducing gas such as hydrogen gas or forming gas can be mentioned. Further, the type of carrier gas may be one type or two or more types. For example, a diluted gas obtained by diluting the same gas as the first carrier gas with another gas (for example, diluted 10-fold) may be further used as the second carrier gas, or air may be used.

In the present invention, the flow rate Q of the carrier gas refers to the total flow rate of the carrier gas. In the above example, the total flow rate of the main carrier gas sent out from the carrier gas source 102a and the flow rate of the dilution carrier gas sent out from the dilution carrier gas source 102b is defined as the flow rate Q of the carrier gas.

The flow rate Q of the carrier gas is appropriately determined depending on the size of the film forming chamber and the substrate, but is usually 1 to 60 L/min, preferably 2 to 40 L/min.

(Film Formation Method)

Next, an example of the film forming method according to the present invention will be described with reference to FIG. 2. First, the raw material solution 104a is housed in the mist generation source 104 of the mist-forming unit 120, and the substrate (crystalline substrate) 110 is placed on the hot plate 108 directly or through the wall of the film forming chamber 107, and the hot plate 108 is operated. Since lithium tantalate has a large coefficient of thermal expansion, it is preferable to gradually raise the temperature from a low temperature.

Next, the flow control valves 103a and 103b are opened to supply the carrier gas from the carrier gas sources 102a and 102b into the film forming chamber 107, and the atmosphere of the film forming chamber 107 is sufficiently replaced with the carrier gas. The carrier gas flow rate Q is controlled by adjusting the flow rate of the main carrier gas and the flow rate of the carrier gas for dilution, respectively.

In the step of generating mist, the ultrasonic vibrator 106 is vibrated and the vibration is propagated to the raw material solution 104a through water 105a to mist the raw material solution 104a and generate mist. Next, in the step of transporting the mist with the carrier gas, the mist is transferred from the mist-forming unit 120 to the film forming unit 140 via the transport section 109 by the carrier gas, and is introduced into the film forming chamber 107. In the process of forming a film, the mist introduced into the film forming chamber 107 is heat-treated by the heat of the hot plate 108 in the film forming chamber 107 and undergoes a thermal reaction to form a film on the substrate (crystalline substrate) 110.

A buffer layer may be formed before the formation of the crystalline oxide film containing gallium as a main component. As the material of the buffer layer, $Al_2O_3$, $Ga_2O_3$, $Cr_2O_3$, $Fe_2O_3$, $In_2O_3$, $Rh_2O_3$, $V_2O_3$, $Ti_2O_3$, $Ir_2O_3$ or the like are preferably used. The buffer layer can be formed by a known method such as a sputtering method or a vapor deposition method, but it is preferably a mist CVD method as in the present invention. Specifically, one or more metals selected from aluminum, gallium, chromium, iron, indium, rhodium, vanadium, titanium, and iridium are dissolved or dispersed in water in the form of a complex or salt, and it can be suitably used as a raw material aqueous solution. Examples of the form of the complex, an acetylacetonate complex, a carbonyl complex, an ammine complex, hydride complex or the like can be mentioned. Examples of form of the salt, metal chloride salt, metal bromide salt, metal iodide salt or the like can be mentioned. Further, a salt solution in which the above metal is dissolved in hydrobromic acid, hydrochloric acid, hydrogen iodide or the like can also be used. The solute concentration is preferably 0.01 to 1 mol/L. For other conditions, the buffer layer can be formed in the same manner as described above. After forming a film of the buffer layer to a predetermined thickness, a crystalline oxide film containing gallium as a main component is formed by the above method. The thickness of the buffer layer is preferably 0.1 μm to 2 μm.

(Heat Treatment)

The obtained laminated structure may be heat-treated at 600 to 1000° C. As a result, unreacted species or the like in the film are removed, and a higher quality laminated structure can be obtained. The heat treatment may be carried out in the air or in oxygen atmosphere, or in an atmosphere of an inert gas such as nitrogen or argon. The heat treatment time is appropriately determined, but can be, for example, 5 to 240 minutes.

(Film Quality Evaluation)

The composition of the obtained film is evaluated by elemental analysis by energy dispersive X-ray analysis (EDS). The crystallinity is evaluated by X-ray diffraction. The crystallinity of the film is evaluated depending on the presence or absence of peaks near $2\theta=38.4°$ (peaks of $\beta$-$Ga_2O_3$) and peaks near $2\theta=40.3°$ (peaks of $\alpha$-$Ga_2O_3$), and the half width of the locking curve of these peaks.

(Peeling)

The crystalline substrate may be peeled off from the crystalline oxide film. The peeling means is not particularly limited and may be a known means. For example, a means for peeling by applying a mechanical impact, a means for peeling by applying heat and utilizing thermal stress, a means for peeling by applying vibration such as ultrasonic waves, a means for etching and peeling, laser lift-off, or the like can be mentioned. By the peeling, a crystalline oxide film can be obtained as a free-standing film.

(Electrode)

A general method can be used for forming the electrodes required for forming the semiconductor device. That is, in addition to vapor deposition, sputtering, CVD, plating, etc., any printing method such as bonding with a resin or the like may be used. The electrode materials include metals such as Al, Ag, Ti, Pd, Au, Cu, Cr, Fe, W, Ta, Nb, Mn, Mo, Hf, Co, Zr, Sn, Pt, V, Ni, Ir, Zn, In, Nd and other metals, as well as metal oxide conductive films such as tin oxide, zinc oxide, indium oxide, indium tin oxide (ITO) and indium zinc oxide (IZO), and organic conductive compounds such as polyaniline, polythiophene or polypyrrole. Either of these may be used, and two or more of these alloys and mixtures may be used. The thickness of the electrode is preferably 1 to 1000 nm, more preferably 10 to 500 nm.

EXAMPLES

Hereinafter, the present invention will be described in detail with reference to examples, but this does not limit the present invention.

Example 1

Based on the above-mentioned method for producing a laminated structure, a film of gallium oxide ($\beta$-$Ga_2O_3$) having a $\beta$-gallia structure was formed to obtain a laminated structure.

Specifically, first, a lithium tantalate single crystal substrate having a congruent composition (Li/(Li+Ta) value of 0.485) was prepared as a crystalline substrate. The lithium tantalate single crystal produced by the Czochralski method was Z-axis cut, processed into a C-plane substrate, subjected to multi polarization treatment of heat treatment at 700° C. for 10 hours, and the surface was polished to make surface roughness Ra=0.5 nm. Next, as a raw material aqueous solution, an aqueous solution of gallium bromide 0.1 mol/L was prepared, and a 48% hydrobromic acid solution was further contained so as to have a volume ratio of 10%, which was used as a raw material solution 104a.

The raw material solution 104a obtained as described above was housed in the mist generation source 104. Next, a 4-inch (100 mm diameter) c-plane lithium tantalate substrate as the substrate (crystalline substrate) 110 was placed on the hot plate 108 in the film forming chamber 107, and the hot plate 108 was operated to raise the temperature to 400° C.

Subsequently, the flow control valves 103a and 103b were opened to supply nitrogen gas as a carrier gas from the carrier gas sources 102a and 102b into the film forming chamber 107, and the atmosphere of the film forming chamber 107 was sufficiently replaced with the carrier gas. The flow rate of the main carrier gas was adjusted to 4 L/min, and the flow rate of the diluting carrier gas was adjusted to 20 L/min. Namely, the carrier gas flow rate was set to Q=24 L/min.

Next, the ultrasonic vibrator 106 was vibrated at 2.4 MHz, and the vibration was propagated to the raw material solution 104a through water 105a to mist the raw material solution 104a and generate mist. This mist was introduced into the film forming chamber 107 by the carrier gas via the supply pipe 109*a*. Then, the mist was thermally reacted in the film forming chamber 107 under atmospheric pressure at 400° C. to form a thin film of gallium oxide ($\beta$-$Ga_2O_3$) having a $\beta$-gallia structure on the substrate (crystalline substrate) 110. The film formation time was 15 minutes.

As a result of elemental analysis of the obtained film by EDS, it was confirmed that $Ga_2O_3$ was formed. Further, the result of evaluation by the X-ray diffractometer is shown in FIG. 4. When the X-ray source was CuK$\alpha$ ray, the peak of $\beta$-$Ga_2O_3$ (-402) was confirmed in the vicinity of $2\theta$=38.4°. When the locking curve of this peak was measured and the half width was obtained, it was 45 seconds. Further, the obtained gallium oxide film was annealed at 600° C. for 3 hours, but no change was observed in the crystallinity of the film.

Example 2

The film formation and evaluation were performed under the same conditions as in Example 1 except that the film formation temperature was set to 350° C. The half width of the $\beta$-$Ga_2O_3$ peak was 40 seconds. Further, the obtained gallium oxide film was annealed at 600° C. for 3 hours, but no change was observed in the crystallinity of the film.

Example 3

The film formation and evaluation were performed under the same conditions as in Example 1 except that the film formation temperature was set to 550° C. The half width of the $\beta$-$Ga_2O_3$ peak was 53 seconds. Further, the obtained gallium oxide film was annealed at 600° C. for 3 hours, but no change was observed in the crystallinity of the film.

Example 4

As a raw material aqueous solution, a 48% hydrobromic acid solution was contained in 0.1 mol/L of gallium acetylacetonate so as to have a volume ratio of 10% and dissolved, and this was used as a raw material solution 104*a*. Other than this, film formation and evaluation were performed under the same conditions as in Example 1. The half width of the $\beta$-$Ga_2O_3$ peak was 43 seconds. Further, the obtained gallium oxide film was annealed at 600° C. for 3 hours, but no change was observed in the crystallinity of the film.

Example 5

Gallium iodide 0.1 mol/L was used as the raw material aqueous solution 104*a*. Other than this, film formation and evaluation were performed under the same conditions as in Example 1. The half width of the $\beta$-$Ga_2O_3$ peak was 33 seconds. The obtained gallium oxide film was annealed at 600° C. for 3 hours, but no change was observed in the crystallinity of the film.

Example 6

Tin (II) chloride was mixed with the aqueous solution of the raw material in Example 1 at $5\times10^{-4}$ mol/L, and the film was formed and evaluated under the same conditions as in Example 1 except for this. The half width of the $\beta$-$Ga_2O_3$ peak was 37 seconds. The obtained gallium oxide film was annealed at 600° C. for 3 hours, but no change was observed in the crystallinity of the film.

Example 7

The lithium tantalate single crystal substrate was polarized. Other than this, film formation and evaluation were performed under the same conditions as in Example 1. The half width of the $\beta$-$Ga_2O_3$ peak was 52 seconds. The obtained gallium oxide film was annealed at 600° C. for 3 hours, but no change was observed in the crystallinity of the film.

Example 8

A buffer layer was provided on a lithium tantalate single crystal substrate. Specifically, as a raw material aqueous solution, a 48% hydrobromic acid solution was contained in 0.1 mol/L of chromium acetylacetonate so as to have a volume ratio of 10% and dissolved, and this was used as a raw material solution. Others were formed under the same conditions as in Example 1. As a result of elemental analysis by energy dispersive X-ray analysis (EDS), it was confirmed that it was $Cr_2O_3$. Subsequently, a gallium oxide film was formed on the obtained film under the same conditions as in Example 1. As a result of elemental analysis by EDS, it was confirmed that $Ga_2O_3$ was formed.

Comparative Example

As the crystalline substrate, C-plane sapphire was used. Other than this, film formation and evaluation were performed under the same conditions as in Example 1. The peak of $\beta$-$Ga_2O_3$ did not appear, and the peak of $\alpha$-$Ga_2O_3$ appeared instead. When the obtained gallium oxide film was annealed at 600° C. for 3 hours, the crystal structure of the film was partially changed and a peak of $\beta$-$Ga_2O_3$ appeared.

In each of Examples 1 to 7, a $\beta$-$Ga_2O_3$ film having good crystallinity was obtained even though the film formation temperature was relatively low. $\beta$-$Ga_2O_3$ is thermally most stable and can be suitably used for semiconductor devices.

Example 9

The gallium oxide film obtained by the same method as in Example 1 was annealed in air at 600° C. for 3 hours, and the film densities before and after the annealing treatment were compared. It was 5.84 g/cm$^3$ before annealing, but it became 5.89 g/cm$^3$ after annealing, and an increase in film density was confirmed. The film density was estimated by the X-ray reflectivity method. Further, when annealed at 1000° C. for 1 hour, a further increase to 6.02 g/cm$^3$ was confirmed. It is considered that this is a result of removing unreacted species in the film and obtaining a higher quality film. This makes it possible to manufacture higher quality semiconductor devices.

It should be noted that the present invention is not limited to the above-described embodiments. The embodiments are just examples, and any examples that have substantially the same feature and demonstrate the same functions and effects as those in the technical concept disclosed in claims of the present invention are included in the technical scope of the present invention.

The invention claimed is:

1. A laminated structure comprising a crystalline substrate and a crystalline oxide film containing gallium as a main component and having a $\beta$-gallia structure, wherein the crystalline substrate is a lithium tantalate single crystal substrate, the crystalline oxide film is $\beta$-$Ga_2O_3$, a main surface of the lithium tantalate single crystal substrate is a C-plane, and a crystal orientation of the lithium tantalate single crystal substrate is within Z±10°.

2. The laminated structure according to claim 1, wherein the crystalline oxide film has a film thickness of 1 μm or more.

3. The laminated structure according to claim 1, wherein the area of the crystalline oxide film is 100 mm$^2$ or more.

4. The laminated structure according to claim 1, wherein a volume resistivity in a thickness direction of the lithium tantalate single crystal substrate is $1.0 \times 10^{11}$ Ω·cm or more and $2.0 \times 10^{13}$ Ω·cm or less, and a ratio of a maximum value to a minimum value of the volume resistivity within the substrate is 4.0 or less.

5. The laminated structure according to claim 1, wherein an average polarization domain size of a surface of the lithium tantalate single crystal substrate is 5 μm or less.

6. The laminated structure according to claim 1, wherein a surface of the lithium tantalate single crystal is a congruent composition.

\* \* \* \* \*